US007897974B2

(12) United States Patent
Hung et al.

(10) Patent No.: US 7,897,974 B2
(45) Date of Patent: Mar. 1, 2011

(54) SOLID-STATE LIGHT EMITTING DISPLAY AND FABRICATION METHOD THEREOF

(75) Inventors: Chia-Hung Hung, Hsinchu (TW); Chia-Chiang Chang, Hsinchu (TW); Chun-Hung Lin, Hsinchu (TW)

(73) Assignee: Industrial Technology Research Institute, Hsinchu Hsien (TW)

( * ) Notice: Subject to any disclaimer, the term of this patent is extended or adjusted under 35 U.S.C. 154(b) by 657 days.

(21) Appl. No.: 11/295,504

(22) Filed: Dec. 7, 2005

(65) Prior Publication Data

US 2006/0261343 A1 Nov. 23, 2006

(30) Foreign Application Priority Data

May 20, 2005 (TW) .............................. 94116425 A

(51) Int. Cl.
*H01L 29/04* (2006.01)

(52) U.S. Cl. .......................................... 257/72; 257/347

(58) Field of Classification Search .................... 257/72, 257/59, 347, 98, E21.001; 438/26, 151
See application file for complete search history.

(56) References Cited

U.S. PATENT DOCUMENTS

| | | | | |
|---|---|---|---|---|
| 5,184,114 | A | 2/1993 | Brown | |
| 5,893,721 | A | 4/1999 | Huang et al. | |
| 6,157,047 | A * | 12/2000 | Fujita et al. | 257/51 |
| 6,331,063 | B1 * | 12/2001 | Kamada et al. | 362/237 |
| 6,848,819 | B1 | 2/2005 | Arndt et al. | |
| 6,849,877 | B2 | 2/2005 | Yamazaki et al. | |
| 6,884,646 | B1 * | 4/2005 | Wu et al. | 438/22 |
| 2004/0026708 | A1 * | 2/2004 | Chen | 257/99 |
| 2005/0077531 | A1 * | 4/2005 | Kim | 257/98 |
| 2006/0132021 | A1 * | 6/2006 | Naberhuis et al. | 313/493 |

FOREIGN PATENT DOCUMENTS

| | | |
|---|---|---|
| CN | 2324604 Y | 6/1999 |
| CN | 100419817 C | 9/2008 |
| EP | 0253244 | 1/1988 |
| TW | I237881 | 8/2005 |
| TW | I298550 | 7/2008 |

* cited by examiner

*Primary Examiner* — Thomas L Dickey
*Assistant Examiner* — Fazli Erdem
(74) *Attorney, Agent, or Firm* — Rabin & Berdo, P.C.

(57) ABSTRACT

A solid-state light emitting display and a fabrication method thereof are proposed. The light emitting display includes a metallic board formed with conductive circuits, and a plurality of luminous microcrystals disposed on a surface of the metallic board and electrically connected to the conductive circuits. The metallic board provides the features of lightness and thinness, and flexibility, and the luminous microcrystals are in the form of light emitting components, so as to improve the luminous efficiency of display and attain the effect of environmental protection and energy saving, thereby providing display technology with performance satisfactory for various display requirements.

15 Claims, 4 Drawing Sheets

SOLID-STATE LIGHT EMITTING DISPLAY AND FABRICATION METHOD THEREOF

FIELD OF THE INVENTION

The present invention relates to displays and fabrication methods thereof, and more particularly, to a solid-state light emitting display and a fabrication method thereof with a flat-panel display technology.

BACKGROUND OF THE INVENTION

In order to fulfill visual requirement and more information contained, the demand for the display size and resolution becomes more and more high, thus, the FDP (flat display panel) has become an important component part of electronic product. However, the characteristic of curtailing the display volume has not yet fulfilled the market requirement for the display henceforth, presently, the flat-panel display technology has developed towards the direction of low cost, low power consumption, high quality, digitalization, portability, flexibility (such as soft display), colorization and the like, and due to the big potential market, it is also widely applied in the industry, such as video, information, communication, household appliances, consumption and the like.

In resent years, the FDP (Flat Display Panel), such as LCD (Liquid Crystal Display), PDP (Plasma Display Panel), OLED (Organic Light Emitting Diode) display, FED (Field Emission Display) and the like, has greatly progress in the fabricating technology, display characteristic and size augment.

As far as the LCD (Liquid Crystal Display) without auto radiating is concerned, the LCD has the features, e.g. color saturation is low (about 70% NTCS), reaction time is long (about 16 ms), visual angle is narrow, resolution is high, power consumption is big (the backlight occupation coefficient is lower than 6%), the liquid crystal material is needed pressurizing while flexibility is difficult and the like, thus, with the trend of the technique requirement for high color saturation, relatively short reaction time, environmental protection and energy saving, lightness and thinness, flexibility and the like, the conventional display is meeting challenges of specification limitation of various types of displays.

As far as the spontaneous light emitting display is concerned, PDP (Plasma Display Panel) has the features, e.g. color saturation is medium (about 80% NTCS), reaction time is short (less than 1 ms), light is emitted in the same direction and visual angle is wide, resolution is low, power consumption is big, vacuum packing is needed while flexibility is difficult and the like; OLED (Organic Light Emitting Diode) display has the features, e.g. color saturation is high (about 100% NTCS), reaction time is short (less than 1 ms), light is emitted in the same direction and visual angle is wide, resolution is high, power consumption is small, flexibility is feasible, the OLED light emitting layer is needed pressurizing for protection and the like; FED (Field Emission Display) has the features, e.g. color saturation is medium (about 80% NTCS), reaction time is short (less than 1 ms), light is emitted in the same direction and visual angle is wide, resolution is high, power consumption is small, vacuum packing is needed while flexibility is difficult and the like; accordingly, the developing spontaneous light emitting display can not meet various display requirements.

Synchronously, the technique of correlative patents is, e.g., the technique of U.S. Pat. Nos. 5,184,114, 5,893,721, and 6,849,877 B2.

For example, U.S. Pat. No. 5,184,114 proposes a LED (Light Emitting Display) true color display. The patent mainly adopts LED light/LED module as light emitting component, PCB (Printed Circuit Board) as substrate and component mount technology as main fabricating process, the luminous homogeneity makes the LED module assembled just after selected; however, so far the minimum image pitch of the correlative display to the patent is three millimeters, and the display doesn't have flexibility. Accordingly, such conventional technology not only has poor resolution, but also can not be applied in the product requiring flexure, it merely adapts to be applied in the large-scale true color display with high unit price, e.g., outdoor version video-wall.

U.S. Pat. No. 5,893,721 proposes a LED (Light Emitting Display) array display. The patent mainly employs LED wafer to fabricate the LED array and integral array with main fabricating process such as lithography, etch and deposition, and then an active matrix LED array display is formed; however, the luminous homogeneity is attained through that the LED array display is fabricated from the same LED wafer, so that the luminous efficiency of each pixel is different, even through the image pitch is 20 to 40 μm, quality of such conventional technology is just passable; Furthermore, since that the fabricating process of LED array is complication, the cost is too high and the display can not be applied in the product requiring flexure, thereby the development of such conventional technology application is limited.

U.S. Pat. No. 6,849,877 B2 proposes a fabrication of light emitting display. The patent mainly adopts OLED as light emitting component, plastic board as substrate and patterned deposition as main fabricating process to fabricate active/passive display system with the image pitch of 100 to 200 μm and having flexibility; the luminous homogeneity of this technique is fabricated by the OLED array dealt with sputtering, and can not be replaced, static problem can be occurred by using the plastic that can not conduct electricity as substrate. Accordingly, such conventional technology can not replace the light emitting component as required, except for static problem, that using plastic as substrate can be also adverse to emit heat for the light emitting component of the display.

From the above mentioned, there's no display technology that can meet various display requirements. Accordingly, there exists a strong need in the art for a light emitting component with high efficiency for providing excellent luminous efficiency and reaction time, and for simplifying the encapsulation fabricating process for concurrently upgrading the reliability and longevity of the display to solve various drawbacks of the above-described conventional technology, so as to provide display technology with high quality, environmental protection and energy saving, lightness and thinness, and flexibility.

SUMMARY OF THE INVENTION

Accordingly, it is an objective of the present invention to solve the aforementioned problems by providing a solid-state light emitting display and fabrication method thereof with high quality, environmental protection and energy saving, lightness and thinness, and flexibility.

It is another objective of the present invention to provide a solid-state light emitting display and fabrication method thereof which provides excellent photoelectric effects, e.g., luminous efficiency and reaction time.

It is a further objective of the present invention to provide a solid-state light emitting display and fabrication method thereof which simplifies the encapsulation fabricating process, thereby concurrently upgrading the reliability and longevity of the display.

It is yet another objective of the present invention to provide a solid-state light emitting display and fabrication method thereof which makes the light emitting component of the display have preferable approach for heat emission.

It is one other objective of the present invention to provide a solid-state light emitting display and fabrication method thereof which eliminates static problem by selecting the metallic substrate.

In order to attain the object mentioned above and the others, a solid-state light emitting display and fabrication method thereof according to the present invention is proposed, the solid-state light emitting display at least comprises a metallic board formed with a conductive circuitry and a plurality of luminous microcrystals disposed on the surface of the metallic board and electrically connecting with the conductive circuitry. The method for fabricating the solid-state light emitting display at least comprises, providing a metallic board formed with a conductive circuitry, and setting a plurality of luminous microcrystals on the surface of the metallic board and electrically connecting the luminous microcrystals with the conductive circuitry. The step of providing a metallic board formed with a conductive circuitry includes, polishing and planishing a metallic board, setting an insulating layer on the metallic board, setting a conductive circuit layer on the insulating layer, and removing the insulating layer at the position where assembling the luminous microcrystals on the metallic board. During the steps of setting a plurality of luminous microcrystals on the surface of the metallic board and electrically connecting the luminous microcrystals with the conductive circuitry, which comprises, setting a conductive connecting device for electrical connection on the conductive circuitry and luminous microcrystals, wherein, further comprising, setting a protection layer on the conductive circuitry, the luminous microcrystals and the conductive connecting device, or setting a protection layer on the conductive circuitry, the luminous microcrystals and the conductive connecting device, and setting a condensing layer on the protection layer.

Preferably, the metallic board is one of the inflexible sheet and flexible sheet. The metallic board is selected from one of the stainless steel and aluminum alloy, the stainless steel number is preferably one of 304, 316 and 430, and the aluminum alloy number is preferably one of that from two series to six series, the thickness of the metallic board can be selected under 500 μm.

The conductive circuitry at least includes a plurality of electrical connecting pads and IC (integrated circuit) components, wherein, the IC component is selected from one of groups composed of active component, passive component and TFT (thin-film transistor) component. An insulating layer is further set between the metallic board and the conductive circuitry, wherein, the insulating layer is preferable silicon dioxide insulating layer, its thickness is less than 10 μm.

In a preferable exemplary embodiment, such luminous microcrystals are combined by light emitting diodes with different and same colors. In another preferable exemplary embodiment, such luminous microcrystals are combined by light emitting diodes with the same color, wherein such luminous microcrystals can be selected ultraviolet light emitting diode or other suitable component, and such luminous microcrystals are combined by fluorescent powder layers covered with different and same colors. More preferably, such luminous microcrystals can be a structure fabricated by the light emitting diode wafer through the microcrystalline fabricating process, and the light emitting diode wafer is fabricated by the epitaxy fabricating process.

In a preferable exemplary embodiment, the solid-state light emitting display according to the present invention further comprises, setting a protection layer for covering such luminous microcrystals and the conductive circuitry; i.e., setting a protection layer on the conductive circuitry, the luminous microcrystals and the conductive connecting device. The protection layer assumes rectangular or wavy microstructure, and the protection layer can be made from the material permeable to light. In another preferable exemplary embodiment, the solid-state light emitting display according to the present invention further comprises, setting a protection layer for covering such luminous microcrystals and the conductive circuitry, and a condensing layer disposed on the protection layer; i.e., setting a protection layer on the conductive circuitry, the luminous microcrystals and the conductive connecting device, and setting a condensing layer on the protection layer. The protection layer and condensing layer assume rectangular or wavy microstructures, and the protection layer and condensing layer can be made from the material permeable to light.

Compared with the conventional technology, the solid-state light emitting display and fabrication method thereof according to the present invention selects the metallic board that is thermally stable and heat-dissipative, it can not only be compatible in the high temperature fabricating process so as to simplify the thin film fabricating process during forming conductive circuitry on the metallic board, but also provide optimal approach for heat emission and earth effect of the solid-state luminous microcrystals. Synchronously, the present invention employs tiny and high performance solid-state luminous microcrystals as light emitting component, so that it can not only improve the shortage of the conventional technology in environmental protection and energy saving, lightness and thickness, flexibility and the like, but also provide the effect, such as high color saturation (about 100% NTCS), short reaction time (less than 1 ms), light emitted in the same direction and wide visual angle, high resolution, high stability and the like. Thereby avoiding the drawbacks of the conventional technology that can not concurrently pay attention to the following, such as low cost, low power consumption, high quality, digitalization, portability, flexibility, colorization and the like, and the present invention even avoids the specification limitation in application.

Accordingly, the solid-state light emitting display and fabrication method thereof according to the present invention possesses the characteristics, such as high quality, environmental protection and energy saving, lightness and thickness, flexibility and the like. The present invention can provide excellent photoelectric effects, e.g., luminous efficiency and reaction time, so it can simplify the encapsulation fabricating process, thereby concurrently upgrading the reliability and longevity of the display, and make the light emitting component of the display have preferable approach for heat emission, concurrently can eliminate static problem caused by using the plastic substrate in the conventional technology. It is more favorable to upgrade the property value of the device by solving various drawbacks of the conventional technology.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

First Embodiment

Figure 1:
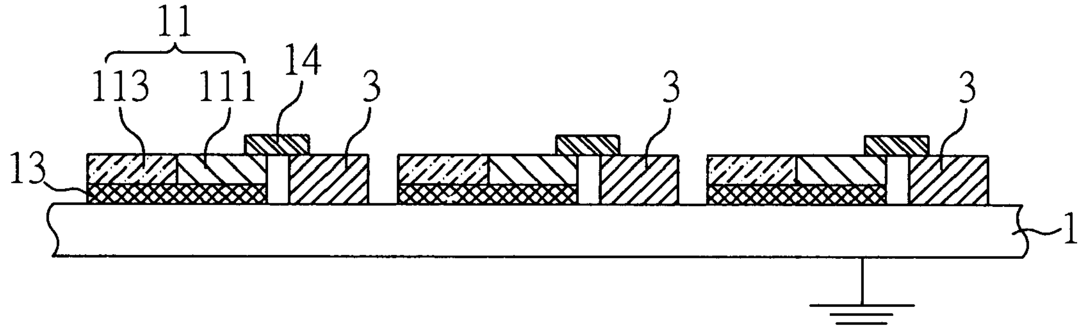
FIG. 1 depicts a schematic diagram of a solid-state light emitting display and a fabrication method thereof according to a first embodiment of the present invention.

FIGS. 1 through 3B show a solid-state light emitting display and a fabrication method thereof according to a first embodiment of the present invention. Referring to FIG. 1, solid-state light emitting display of this embodiment at least comprises a metallic board 1 and a plurality of luminous microcrystals 3.

The metallic board 1 is preferably a flexible sheet, its thickness is, e.g., under 500 μm, but it is not limited to this, e.g. it can also be an inflexible sheet. The metallic board 1 can be selected from stainless steel, such as number 304, 316, 430 aluminum alloy, such as series 2 to series 6, and plate that is made from other suitable metal, and the metallic board 1 has formed conductive circuitry 11 thereon. In this exemplary embodiment, the conductive circuitry 11 can be fabricated by the conventional IC (integrated circuit) fabricating process or other suitable fabricating process, so as to make the conductive circuitry 11 include a plurality of electrical connecting pads 111 and IC (integrated circuit) components 113. To illustrate the drawing in a clear and concise manner, the drawing in the present application is directed to merely part of the metallic board 1 and conductive circuitry 11. The electrical connecting pads 111 can be, e.g., bond pad made from gold, the IC component 113 can be, e.g., active component, passive component, TFT (thin-film transistor) component or other suitable component, but they are not limited to all these. Concurrently, the metallic board 1 can perform contact or non-contact or the like polishing and smoothing fabricating process, so as to keep the surface flat. Furthermore, a silicon oxide insulating layer 13 is further set between the metallic board 1 and the conductive circuitry 11, thereby avoiding short circuit of the metallic board 1 for contacting with the conductive circuitry 11, the thickness of the insulating layer 13 is e.g., less than 10 μm.

Figure 2A:
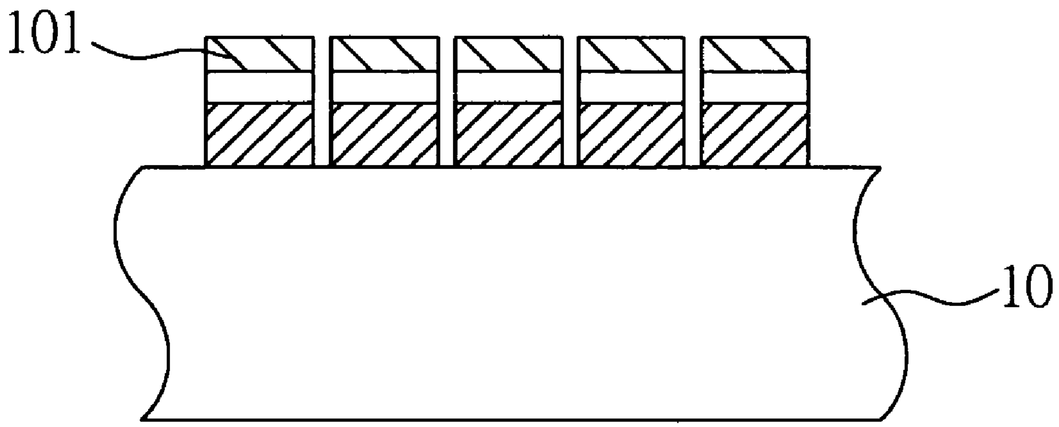
FIGS. 2A and 2B are schematic diagrams showing steps of a method of fabricating luminous microcrystals of FIG. 1 according to the present invention.
Figure 2B:
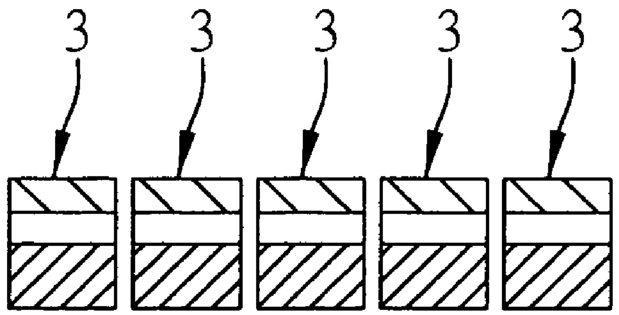

The luminous microcrystals 3 is disposed on the surface of the metallic board 1 and set a conductive connecting device 14 to electrically connect with the conductive circuitry 11; before setting the luminous microcrystals 3 on the metallic board 1, firstly removing the insulating layer 13 at the position where setting the luminous microcrystals 3 on the metallic board 1, so that the luminous microcrystals 3 can contact and then conduct with the metallic board 1. In the exemplary embodiment, such luminous microcrystals 3 are fabricated by the light emitting diode wafer through the microcrystalline fabricating process, and the light emitting diode wafer is fabricated by the epitaxy fabricating process. Microcrystalline fabricating process is shown in FIG. 2A, epitaxial layer 101 including a plurality of light emitting diodes as luminous microcrystals is formed on the substrate for epitaxy 10 by light emitting diode wafer through dry etching technology, and the light emitting diode wafer is fabricated by the conventional epitaxy fabricating process, when removing the substrate for epitaxy 10 and detaching the epitaxial layer 101, structures of many tiny bare crystals, i.e. luminous microcrystals 3 shown in FIG. 2B is formed. At this time, by virtue of the self-assembly technology, such as pick-and-place assembly of single component, parallel assembly, or the other suitable assembly technology, the luminous microcrystals 3 are assembled on the metallic board 1 formed conductive circuitry thereon, and the electrical connecting is completed. In other words, the method for fabricating solid-state light emitting display of this embodiment at least comprises: providing a metallic board 1 formed conductive circuitry 11 thereon; and setting a plurality of luminous microcrystals 3 on the surface of the metallic board 1 and electrically connecting the luminous microcrystals 3 with the conductive circuitry 11. The step of providing a metallic board formed with a conductive circuitry includes, polishing and planishing a metallic board, setting an insulating layer on the metallic board, setting a conductive circuit layer on the insulating layer, and removing the insulating layer at the position where assembling the luminous microcrystals on the metallic board. During the steps of setting a plurality of luminous microcrystals on the surface of the metallic board and electrically connecting the luminous microcrystals with the conductive circuitry, which comprises, setting a conductive connecting device for electrical connection on the conductive circuitry and luminous microcrystals, wherein, further comprising, setting a protection layer on the conductive circuitry, the luminous microcrystals and the conductive connecting device, or setting a protection layer on the conductive circuitry, the luminous microcrystals and the conductive connecting device, and setting a condensing layer on the protection layer.

The above-described IC (Integrated circuit) fabricating process, smoothness fabricating process, self-assembly fabricating process, epitaxy fabricating process, microcrystalline fabricating process and the like are known in the art, thus, herein will not be described again, the fabricating process of the present invention is not limited to this embodiment, and is capable of other change.

Figure 3A:
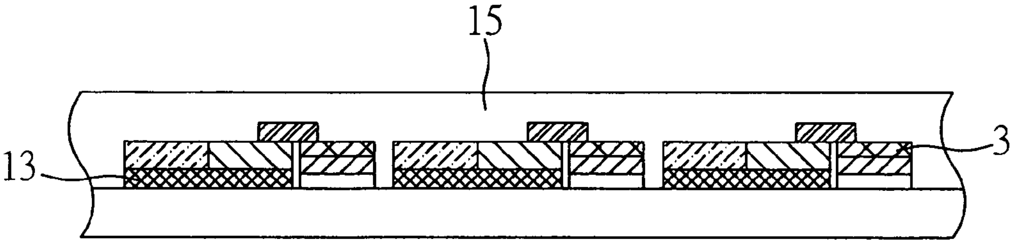
FIGS. 3A and 3B are schematic diagrams showing forming a protection layer on the structure of FIG. 1 according to the present invention.
Figure 3B:
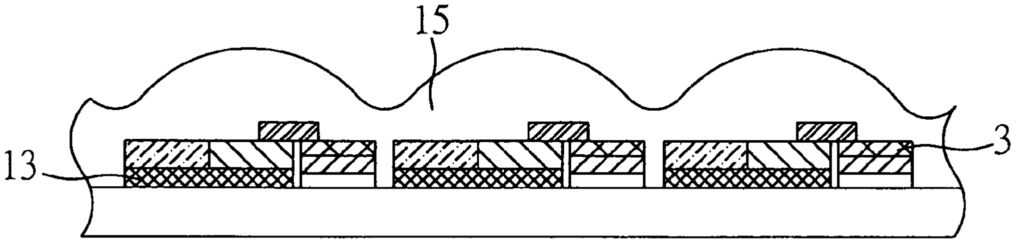

In the exemplary embodiment, such luminous microcrystals 3 can be combined by light emitting diodes with different and same colors, e.g., combined by light emitting diodes with R (red), G (green), B (blue) and the like, and the solid-state light emitting display of the present invention further comprises a protection layer. Referring to FIG. 3A, a protection layer 15 is set for covering such luminous microcrystals 3 and the conductive circuitry 11, the protection layer 15 assumes rectangular microstructure; certainly, due to good stability of such luminous microcrystals 3 in the atmosphere, it is ok as long as the protection layer 15 can protect the surface without achieving the extend of pressurizing or vacuuming as the conventional technology, i.e. protect the luminous microcrystals 3 and make the ray pass through. Preferably, in another exemplary embodiment, referring to FIG. 3B, the protection layer 15 assumes wavy or other capable of focusing light microstructure, and the protection layer 15 can be made from the material permeable to light, so as to provide the effect of, e.g., protecting the luminous microcrystals 3 and the conductive circuitry 11 surface, and the light focusing effect, but it is not used to limit the present invention. Of course, in one another exemplary embodiment, the solid-state light emitting display according to the present invention further comprises, setting a protection layer 15 for covering such luminous microcrystals 3 and the conductive circuitry 11, and a condensing layer (not illustrated) disposed on the protection layer 15, wherein the protection layer 15 and condensing layer assume wavy microstructures, and the protection layer 15 and condensing layer can be made from the material permeable to light, so as to respectively provide the effect of, e.g., protecting the luminous microcrystals 3 and the conductive circuitry 11 surface, and the light focusing effect.

This exemplary embodiment differs from the conventional technology in that it uses metallic board 1 as substrate, except that the metallic board 1 has conductivity, can act as the common electrode of the active type substrate and avoid the static problem during display using and fabricating process, the thermostability of the metal can be compatible in the high temperature IC fabricating process so as to simplify such as thin film fabricating process of the active component in the conductive circuitry, and the metal surface has favorable light reflectivity, so that the ray produced by the luminous microcrystals 3 acting as light emitting component can be reflected to the direction of the user, thereby upgrading lightness, and the heat produced in operating can be dissipated by the relatively high heat conduction coefficient of the metal, thereby solving the most involved heat emission problem of the light emitting component. Concurrently, this exemplary embodiment employs such as luminous microcrystals 3 of the light emitting diode with bare crystal structure as solid-state light emitting component, the luminous microcrystals 3 fabricated by, e.g., the conventional epitaxy fabricating process and microcrystalline fabricating process can provide image pitch of 100 to 200 μm and high efficiency of solid-state light source, thereby providing excellent luminous efficiency and reaction time, and due to the quite small volume, even if bending the metallic board 1, the horizontal position of the luminous microcrystals 3 on the surface of the metallic board can not be changed either, or the luminous microcrystals 3 can not be fallen off, the stability of the solid-state light emitting diode in the atmosphere can simplify the encapsulation fabricating process of the solid-state light emitting display according to the present invention, and concurrently upgrade the reliability and longevity of the display.

Thus, compared with the conventional technology, the solid-state light emitting display and fabrication method thereof according to the present invention can employs solid-state light emitting diode to provide spontaneous light source with energy saving and high photoelectric transducing efficiency, so as to provide display quality with high color saturation of wide color gamut. Furthermore, except for the characteristics of short reaction time and wide visual angle, the stability of the solid-state light emitting diode in the atmosphere can simplify the encapsulation fabricating process of the display and concurrently upgrade the reliability and longevity of the display. Synchronously, the design of the present invention adopts metallic board as substrate, such quite thin metallic board can fabricate thin-film diode with high efficiency and eliminate static, as well as provide optimal approach for heat emission of luminous microcrystals of the light emitting diode, so as to significantly upgrade the luminous efficiency and display quality of the display, thereby solving various drawbacks of the conventional technology that can not meet various requirement characteristics of the display.

Accordingly, the application of the present invention can provide a solid-state light emitting display and fabrication method thereof with high quality, environmental protection and energy saving, lightness and thickness, and flexibility, except for excellent photoelectric effects, e.g., luminous efficiency and reaction time, it can also simplify the encapsulation fabricating process, thereby concurrently upgrading the reliability and longevity of the display, and make the light emitting component of the display have preferable approach for heat emission, as well as can eliminate static problem, thereby the present invention can even be applied in the product requiring flexure and can upgrade the property value.

Second Embodiment

Figure 4:
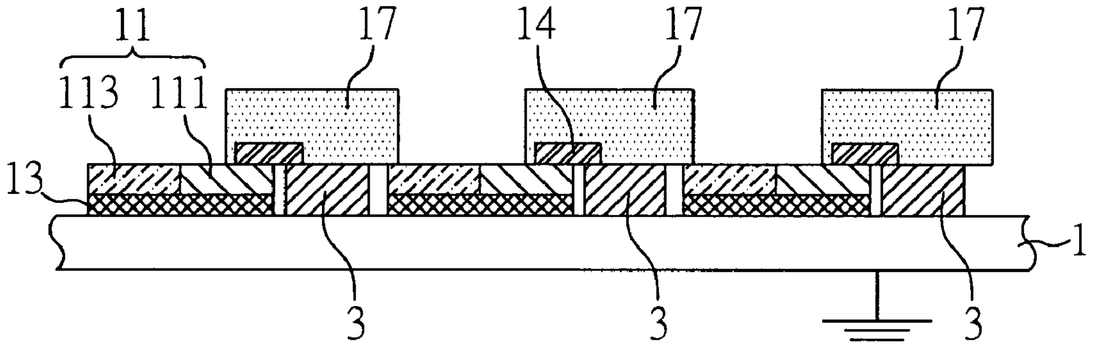
FIG. 4 is a schematic diagram of a solid-state light emitting display and a fabrication method thereof according to a second embodiment of the present invention.

FIG. 4 shows a solid-state light emitting display and a fabrication method thereof according to a second embodiment of the present invention. The components identical or similar to the first exemplary embodiment is expressed as the same or similar component reference numbers, of which the detailed description is left out, in order to illustrate the present invention in a more clear and concise manner.

With reference to FIG. 4, the solid-state light emitting display comprises a metallic board 1 formed with a conductive circuitry, a plurality of luminous microcrystals 3 disposed on the surface of the metallic board 1 and electrically connecting with the conductive circuitry 11, and a fluorescent powder layers 17 at least respectively covering such luminous microcrystals 3. In the exemplary embodiment, such luminous microcrystals 3 can be, e.g., ultraviolet light emitting diode, or other suitable component, and the fluorescent powder layers 17 are formed by putting the fluorescent powders with different and same color on the luminous microcrystals 3 and part of the conductive circuitry 11. Attention should be paid to, the fluorescent powder layers 17 can be respectively assembled by a plurality of combinations with same and different colors, such as R (red), G (green) and B (blue), the luminous microcrystals 3 vitalizes the fluorescent powder layers 17 to produce tricolor, thereby forming the true color effect, but it is not limited to this.

Accordingly, except that employing spontaneous light which can directly produce tricolor, the present invention can also employ, e.g. ultraviolet light of the ultraviolet light emitting diode to vitalize the fluorescent powder layers 17 for producing tricolor, furthermore, both of these can provide display quality with high color saturation of wide color gamut.

In conclusion, the solid-state light emitting display and fabrication method thereof according to the present invention employs the display technology with high quality, environmental protection and energy saving, lightness and thickness, and flexibility, and also uses the solid-state luminous microcrystals with high efficiency as photounit of the display with single pixel, which can provide excellent luminous efficiency and the characteristics of spontaneous light emitting display, such as short reaction time and wide visual angle, and the stability of the solid-state light emitting diode in the atmosphere can simplify the encapsulation fabricating process of the display, and concurrently upgrade the reliability and longevity of the display, application of metallic board can provide high efficiency of the solid-state luminous microcrystals and the optimal approach for heat emission, so as to significantly upgrade the luminous efficiency and display quality of the display. Accordingly, the present invention can solve various drawbacks of the conventional technology, and the present invention has design elasticity, so as to efficiently improve the property value.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A solid-state light emitting display, comprising:

a metallic board formed with conductive circuits;

a plurality of luminous microcrystals disposed on a surface of the metallic board and in direct contact with the metallic board, and electrically connected to the conductive circuits; and an insulating layer disposed between the metallic board and the conductive circuits, wherein a top surface of the conductive circuits is substantially at a same level with a top surface of the luminous microcrystals.

2. The solid-state light emitting display of claim 1, wherein the metallic board is one of an inflexible sheet and a flexible sheet.

3. The solid-state light emitting display of claim 1, wherein the metallic board is made of one of stainless steel and aluminum alloy.

4. The solid-state light emitting display of claim 1, wherein the conductive circuits include a plurality of electrical connecting pads and a plurality of integrated circuit (IC) components.

5. The solid-state light emitting display of claim 4, wherein the IC component is selected from the group consisting of active component, passive component, and thin-film transistor (TFT) component.

6. The solid-state light emitting display of claim 1, wherein the luminous microcrystals are composed of light emitting diodes with different colors and light emitting diodes with a same color.

7. The solid-state light emitting display of claim 1, wherein the luminous microcrystals are composed of light emitting diodes with a same color.

8. The solid-state light emitting display of claim 1, wherein the luminous microcrystals are ultraviolet light emitting diodes.

9. The solid-state light emitting display of claim 1, wherein the luminous microcrystals are formed by covering fluorescent powder layers with different colors and fluorescent powder layers with a same color thereon.

10. The solid-state light emitting display of claim 1, further comprising a protection layer permeable to light, for covering the luminous microcrystals and the conductive circuits.

11. The solid-state light emitting display of claim 1, further comprising:

a protection layer permeable to light, for covering the luminous microcrystals and the conductive circuits; and a condensing layer disposed on the protection layer.

12. The solid-state light emitting display of claim 1, wherein the luminous microcrystals are free from being covered by the conductive circuits.

13. The solid-state light emitting display of claim 4, wherein the electrical connecting pads are bond pads made of gold.

14. The solid-state light emitting display of claim 1, wherein the luminous microcrystals are electrically connected to the conductive circuits with a plurality of conductive connecting devices.

15. The solid-state light emitting display of claim 4, wherein the luminous microcrystals are electrically connected to the electrical connecting pads with a plurality of conductive connecting devices.

* * * * *